United States Patent [19]

Nakano

[11] Patent Number: 4,841,349
[45] Date of Patent: Jun. 20, 1989

[54] SEMICONDUCTOR PHOTODETECTOR DEVICE WITH LIGHT RESPONSIVE PN JUNCTION GATE

[75] Inventor: Motoo Nakano, Yokohama, Japan

[73] Assignee: Fujitsu Limited, Kawasaki, Japan

[21] Appl. No.: 113,324

[22] Filed: Oct. 28, 1987

Related U.S. Application Data

[63] Continuation of Ser. No. 798,187, Nov. 14, 1985, abandoned.

[30] Foreign Application Priority Data

Nov. 16, 1984 [JP] Japan .................. 59-241978

[51] Int. Cl.⁴ .................. H01L 27/14; H01L 31/10; H03K 3/42
[52] U.S. Cl. .................. 357/30; 307/311; 250/578; 357/19; 357/23.1; 357/59
[58] Field of Search .......... 307/311; 357/30, 19, 357/59, 23.14, 23.1; 250/214 SW, 578

[56] References Cited

U.S. PATENT DOCUMENTS

| | | | |
|---|---|---|---|
| 3,207,926 | 9/1965 | Schmader | 307/592 |
| 3,436,623 | 4/1969 | Beer | 357/23.14 |
| 3,459,944 | 8/1969 | Triebwasser | 357/30 |
| 3,648,258 | 3/1972 | Swell, Jr. | 357/30 |
| 4,057,819 | 11/1977 | Owen et al. | 357/30 |
| 4,099,196 | 7/1978 | Simko | 357/59 J |
| 4,236,831 | 12/1980 | Hendrickson | 357/30 |
| 4,385,308 | 5/1983 | Uchida | 357/59 J |
| 4,419,586 | 12/1983 | Phipps | 307/311 |
| 4,564,770 | 1/1986 | Sherman | 307/311 |

OTHER PUBLICATIONS

Kamins et al., "A Monolithic Integrated . . . Polysilicon", *IEEE Transactions on Electron Devices*, vol. ED-27, No. 1, 1/80.

Patents Abstracts of Japan, vol. 6, No. 107, Jun. 17, 1982, Mitsubishi Denki K.K., "Photo Detector".

*Primary Examiner*—William D. Larkins
*Assistant Examiner*—Jerome Jackson, Jr.
*Attorney, Agent, or Firm*—Staas & Halsey

[57] ABSTRACT

A semiconductor photodetector device comprises an insulating gate field effect transistor having a gate in which a PN junction (J) is formed on an insulating layer. The gate is formed of a gate electrode (14) of P+-type single crystalline silicon and a gate extension portion (17) of N+-type single crystalline silicon. Electric charges generated by a light falling on an area including the PN junction are accummulated in the gate electrode (14). A signal of the accumulated electric charge is amplified by the transistor to obtain an output signal ($V_{out}$) for detection.

12 Claims, 4 Drawing Sheets

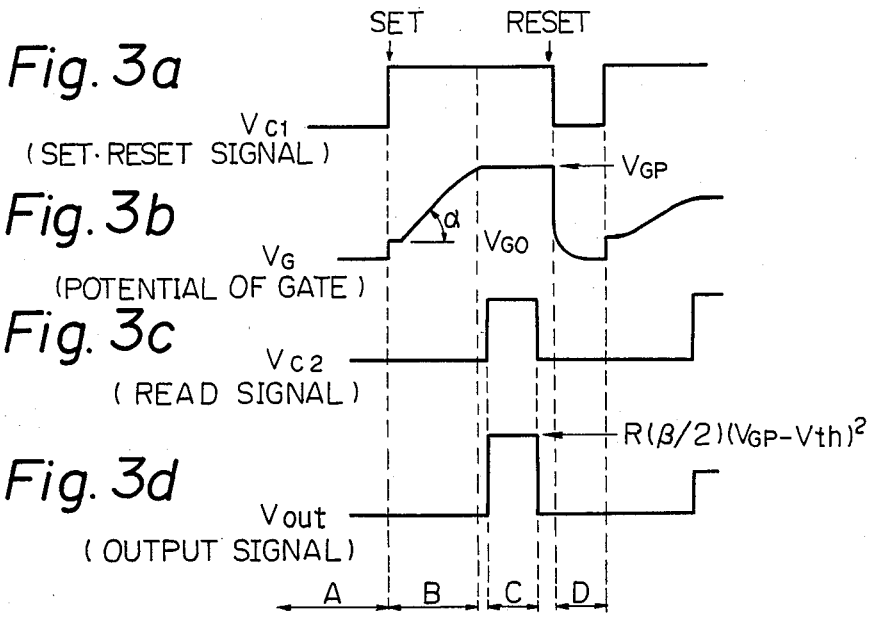
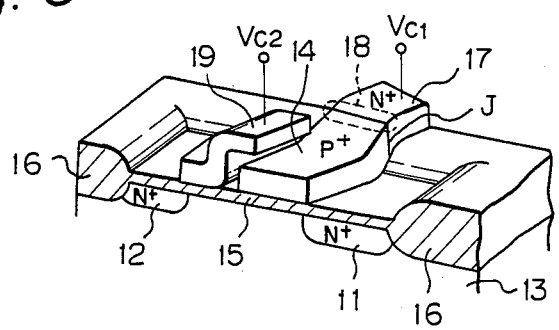

SEMICONDUCTOR PHOTODETECTOR DEVICE WITH LIGHT RESPONSIVE PN JUNCTION GATE

This is a continuation of copending application Ser. No. 798,187 now abandoned, filed on Nov. 14, 1985.

BACKGROUND OF THE INVENTION

(1) Field of the Invention

The invention relates to a photodetector, more particularly, to semiconductor photodetector devices serving as image elements of a solid state imaging device.

(2) Description of the Relate Art

Various devices, such as a bipolar transistor type device, an insulating gate field effect transistor (FET), and a charge coupled device (CCD) are used as the semiconductor photodetector devices in the solid state imaging device. All of the above-mentioned devices have a P-type (or N-type) silicon substrate and an N-type (or P-type) region therein so as to form a PN junction, and utilize the photovoltaic-effect brought about by illuminating the PN junction region with light. Such a light receiving structure basically corresponds to a P-N junction photodiode. In this case, when light falls on the P-N junction photodiode in which a P-type silicon substrate is grounded and a N-type region formed in the substrate is at a positive potential, i.e., the PN junction is reverse-biased, the energy of the light photons creates electron-hole pairs in a depletion region by exciting electrons in the P-type substrate, and causing holes to form in the N-type region due to photoexcitation. The electron-hole pairs are separated by the electric field, leading to a current flow in an external circuit as carriers drift across the depletion region. The total current (photocurrent) of the P-N photodiode is the drift current due to carriers generated in the depletion region and the diffusion current due to carriers generated in the P-type substrate and the N-type region and diffusing into the PN junction.

Such a PN junction photodiode brings about the following disadvantages:

(i) Since an electric charge generated by light irradiation is allowed to flow, the sensitivity of the photodiode to a faint light is low.

(ii) Where plural PN junction photodiodes are closely arranged in a solid state imaging device, and when a very strong light falls on one of those photodiodes, a portion of the electric charge generated by light irradiation flows into an adjacent photodiode so that the resolution of the imaging device is deteriorated.

(iii) Since electrons generated in the P-type substrate by a strong light do not easily disappear, such electrons bring about a photo-current flow continuing for a while after the extinguishment of the light, i.e., so-called lag or persistence.

SUMMARY OF THE INVENTION

An object of the present invention is to provide a semiconductor photodetector device without the above-mentioned disadvantages.

Another object of the present invention is to provide improved semiconductor photodetectors for a solid state imaging device.

The above-mentioned and other objects of the present invention are attained by providing a semiconductor photodetector device comprising an insulating gate field effect transistor (FET) having a channel region of a first conductivity type, a gate electrode of a second conductivity type, opposite to the first conductivity type, and a gate extension portion of the first conductivity type, the gate electrode and the gate extension portion forming a PN junction outside the channel region and an area including the PN junction receiving a light.

Preferably, the gate electrode and gate extension portion are made of single crystalline silicon.

It is possible to make only the joining portions of the gate electrode and the gate extension portion of single crystalline silicon, in which joining portion a PN junction is formed.

The photodetection process in the photodetector device according to the present invention is performed in the following manner.

The PN junction is reverse biased and the joining area including the PN junction illuminated by light. An electric charge generated in a depletion region formed at the PN junction is accumulated in the gate electrode of doped single crystalline or polycrystalline silicon, so that the FET is in an "on" state. In such a condition, when a read signal (e.g., pulse signal) is applied to a drain of the FET, an output signal from a source region of the FET is detected and it can be determined if the current density of the output signal is proportional to the light intensity. Directly after the detection, the PN junction is forward biased to remove the charge accumulated in the gate electrode, and thus the photodetector element is reset.

Where a faint light is detected, it is possible to obtain a sufficient output signal by extending the accumulating time for electric charges in the gate electrode. Thus the sensitivity to a faint light can be improved.

The gate electrode including an electric charge accumulating portion and a charge generating portion is completely insulated from a semiconductor substrate by a gate insulating layer and an isolation insulating layer. Therefore, an electric charge generated in one of the photodetector devices according to the present invention does not affect adjacent elements. As a result, the resolution of the imaging device is not deteriorated.

Furthermore, directly after the detection, the electric charge in the gate electrode can be removed (escaped) through the gate extension portion, so that lag or persistence can be decreased.

BRIEF DESCRIPTION OF THE DRAWINGS

The present invention will become more apparent from the description of the preferred embodiments set forth below with reference to the accompanying drawings, in which:

FIG. 3a is a waveform of a control signal $V_{CI}$ applied to the gate extension portion;

FIG. 3b is a waveform of a potential of the gate electrode;

FIG. 3c is a waveform of a reading signal;

FIG. 3d is a waveform of an output signal of the photodetector device;

DESCRIPTION OF THE PREFERRED EMBODIMENTS

Figure 1:
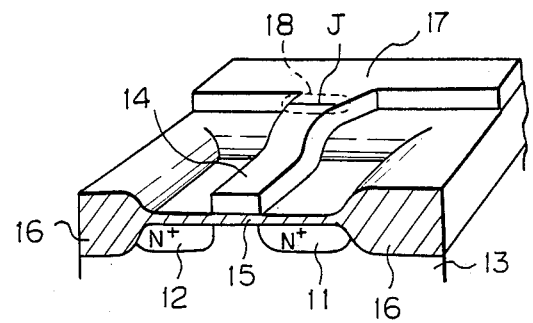
FIG. 1 is a partial perspective view of a semiconductor photodetector device according to the present invention.
Figure 2:
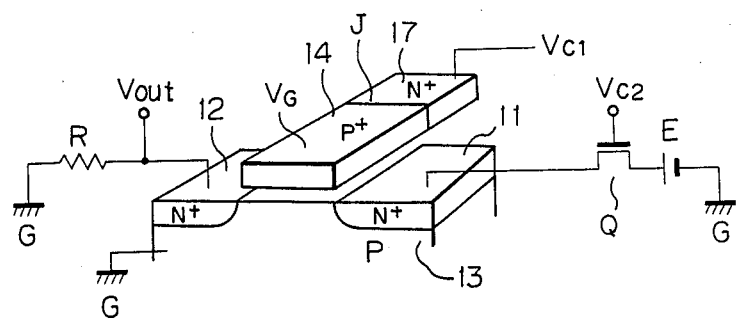
FIG. 2 is a schematic diagram of the semiconductor photodetector device of FIG. 1 for detection.

Referring to FIG. 1, a semiconductor photodetector device according to the present invention comprises an insulating gate FET having an N+-type drain region 11 and an N+-type source region 12, which are formed in a P-type single crystalline silicon substrate 13, and a gate electrode 14 on a gate oxide layer 15. An isolation oxide layer 16 is formed so as to surround the drain region 11 and source region 12 and a channel region between them, and isolates them from other FETs. The gate electrode 14 is electrically connected with a gate extension portion 17 serving as a conductor line. According to the present invention, the gate electrode 14 is made of a P+-type single crystalline silicon and the gate extension portion 17 is made of an N+-type single crystalline silicon, which are joined so as to form a PN junction J on the isolation oxide layer 16. A light receiving area 18 including the PN junction J is indicated by a broken line.

The FET further has a drain electrode connecting to the drain region 11 and a source electrode connecting to the source region 12, these electrodes are not shown in FIG. 1. Further, the photodetector device in FIG. 1 is provided with a mask with a window (not shown) through which a light falls on the area 18.

A detection operation of the photodetector device of FIG. 1 is now explained with reference to FIGS. 2 and 3a–3d.

The P-type silicon substrate 13 is grounded, and the drain region 11 is connected to a d.c. supply E of, e.g., +5 V, through a read control FET Q, which is made "on" by applying a read signal $V_{C2}$. The source region 12 is connected to a load resistance R and an output signal $V_{out}$ from the source region 12 is obtained. The gate extension portion 17 of N+-type single crystalline silicon is connected to a suitable device (not shown) sending a control signal $V_{C1}$ of, e.g., +5 V, for setting and resetting the photodetector device.

First, the control signal $V_{C1}$ is set to "0" (for a period A), whereby the PN junction J is in the forward direction. Therefore, the potential of the gate electrode 14 is set to "0".

Next, the control signal $V_{C1}$ is changed to a positive voltage and holds it constant. Thus, the PN junction J is in the reverse direction, so that the gate electrode 14 is in a floating condition. Accordingly the gate electrode 14 has a certain potential $V_{G0}$ which is determined by a gate-substrate capacitance and a gate-N+-type region capacitance. The photodetector element is now in a set condition.

Then a light receiving area 18 including the joining portions of the gate electrode 14 and the gate extension portion 17 is illuminated with a light spot passing through a window of a mask (not shown). The light having a photo energy hv generates electron-hole pairs at the PN junction portion. The electrons of the pairs of electron-holes flow into the gate extension portion 17 and the holes move into the gate electrode 14. Thus, a positive charge of the holes accumulates in the gate electrode 14 for an illumination period B, so that the potential of the gate electrode 14 is raised to a certain potential $V_{GP}$, as shown in FIG. 3b. After the illumination, the obtained potential $V_{GP}$ is kept. Since the rise rate α of the gate electrode potential depends on a light intensity, the value of $V_{GP}$ is proportional to the quantity of light. As the result, the FET of the photodetector element is "on".

Under such conditions, when a reading signal $V_{C2}$ of a positive voltage is applied to the read control FET Q for a period C (FIG. 3c), the read control FET2 turns "on" and a positive voltage is applied to the drain region 11. As the result, an output signal $V_{out}$ for the source region 12 is obtained, as shown in FIG. 3d.

Where the conductance β of the read control FET Q is much larger than that of the FET of the photodetector device, the output signal is given by the following formula:

$$V_{out} \approx R(\beta/2)(V_{GP} - V_{th})^2$$

where: R is a load resistance and $V_{th}$ is the threshold voltage of the photodetector FET. The obtained output of the output signal $V_{out}$ is proportional to the quantity of light.

Directly after the detection, the potential of the control signal $V_{C1}$ is returned to "0" for a period D, whereby the charge accumulated in the gate electrode 14 is removed through the gate extension portion 17. Thus, the photodetector device is reset to an initial state.

The photodetector device of FIG. 1 is produced in the following manner.

Figure 4A:
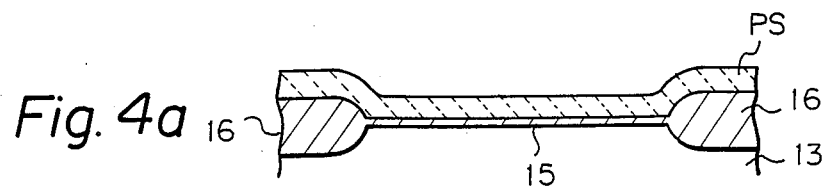
FIGS. 4a to 4e are partial perspective views of a semiconductor photodetector device in various stages of production; and, FIG. 5 is a partial perspective view of a semiconductor photodetector element according to another embodiment of the present invention.

As shown in FIG. 4a, on the P-type single crystalline silicon substrate 13, the isolation oxide layer 16 and the gate oxide layer 15 (having a thickness of, e.g., approximately 30 nm) are formed by a conventional method, e.g., a thermal oxidation method. A polycrystalline silicon layer PS (having a thickness of, e.g., approximately 500 nm) is formed over the oxide layers 16 and 15 by a chemical vapor deposition (CVD) method.

Figure 4B:
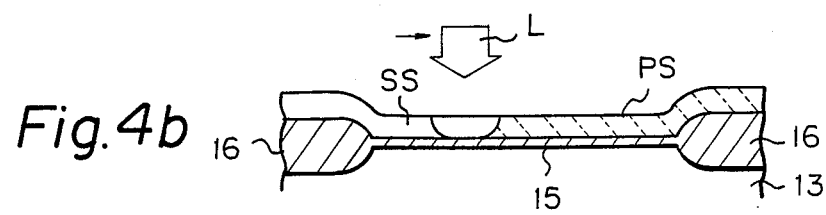

Next, as shown in FIG. 4b, a scanning laser beam L falls on the polycrystalline silicon layer PS so as to melt and recrystallize that layer PS, with the result that it is entirely changed to a single crystalline silicon layer SS. It is possible to use an argon laser having an output of approximately 10 W and a beam spot of approximately 50 μm diameter.

Figure 4C:
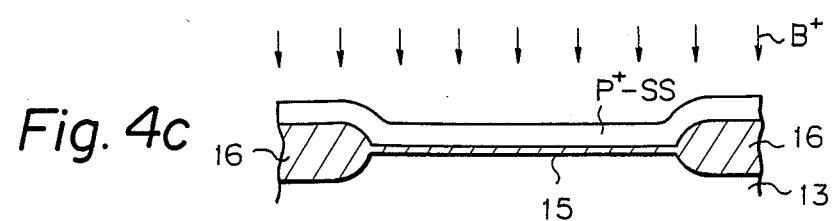

As shown in FIG. 4c, the single crystalline silicon layer SS is doped with boron (B) by an ion-implantation method and is annealed at a temperature of, e.g., approximately 1000° C., for a period of, e.g., 30 minutes. Thus the P+-type single crystalline silicon layer SS having a carrier concentration of approximately $5 \times 10^{18}$ cm$^{-3}$ is obtained. The conditions of the ion-implantation treatment are, e.g., an accelerated energy of 60 keV and a dosage of approximately $2.5 \times 10^{14}$ cm$^{-2}$.

Figure 4D:
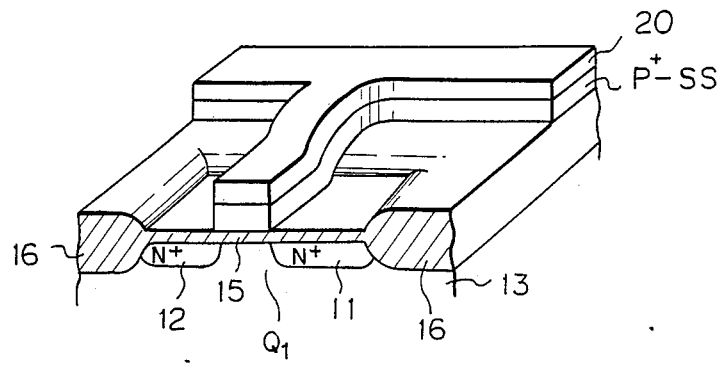

Next, as shown in FIG. 4d, a resist pattern 20 is formed on the P+-type silicon layer SS by a conventional method. Using the resist pattern 20 as a mask, the P+-type silicon layer SS is selectively etched by a suitable etching method, e.g., a reactive ion etching (RIE) method, to form a gate electrode and a gate extension portion. Leaving the resist pattern 20 present, arsenic ions (As+) are implanted into the P-type silicon substrate 13 by an ion-implantation method to form the N+-type drain region 11 and the N+-type source region 12. The conditions of the ion-implantation treatment are, e.g., an accelerated energy of 100 keV and a dosage of approximately $5 \times 10^{15}$ cm$^{-2}$. The resistant pattern 20 of then removed.

Figure 4E:
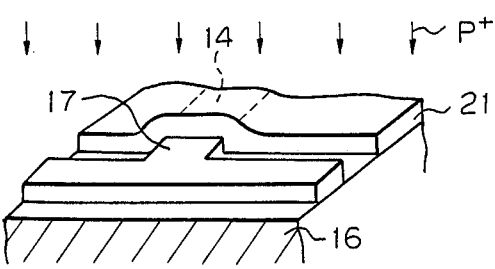

As shown in FIG. 4e, another resist pattern 21 is formed on the exposed surface except for at least the gate extension portion 17. Using the resist pattern 21 as a mask, phosphorus ions (P+) are implanted into the gate extension portion 17 of the P+-type silicon to convert it to an N+-type conductivity type. The conditions of the ion-implantation treatment are, e.g., an accelerated energy of 80 keV and a dosage of approximately $5 \times 10^{15}$ cm$^{-2}$. The resist pattern 21 is then removed. Thereafter an annealing treatment is carried out at a temperature of, e.g., approximately 1000° C., for a period of, e.g., 30 minutes.

Thus the photodetector device comprising the FET is obtained, as shown in FIG. 1. Since the P+-type single crystalline layer is doped with donor impurities (phosphorus ions) having a higher concentration than an acceptor impurity concentration, a PN junction is formed between the gate electrode 14 of the P+-type silicon and the gate extension portion 17 of the N+-type silicon.

Next, a drain electrode, a source electrode, an insulating (passivation) layer, metal conductor lines, and a mask (light screen) with a window corresponding to the light receiving are formed by adopting suitable conventional methods, so that the photodetector element is completed.

It is possible to perform the local single crystallization of the polycrystalline silicon layer PS by controlling the scanning of a laser beam. In this case, only a portion of the polycrystalline silicon layer corresponding to at least the light receiving area 18 (FIG. 1) is illuminated with the laser beam. The PN junction is formed within the formed single crystalline silicon portion. A greater part of the gate electrode 14 is P+-type polycrystalline silicon.

It is also possible to form a P-type region between the P+-type gate electrode and the N+-type gate extension portion by doping a low impurity concentration of acceptors into a portion of the single crystalline silicon layer SS. For example, an ion-implantation treatment for the P-type region is carried out at a dosage 1 to $5 \times 10^{13}$ cm$^{-2}$ lower than for the P+-type gate electrode. The P-type region can increase the sensitivity of the photodetector device.

Referring to FIG. 5, another photodetector device according to a second embodiment of the present invention is shown. The photodetector device illustrated in FIG. 5 has another gate electrode 19 for a reading signal $V_{C2}$ as well as the structure disclosed in FIG. 1. The reference numerals and symbols used in FIGS. 5 and 1 in common indicate the same parts. In this case, the FET is a dual gate type FET and the additional gate electrode 19 is connected to a suitable device sending a reading signal $V_{C2}$. The structure of FIG. 5 contributes to a high integration of the photodetector devices for a solid state imaging device.

In the photodetector device according to the present invention, electric charges generated by light are accumulated and then a signal of the accumulated charges is amplified by an FET for detection. Therefore, the sensitivity to a faint light can be increased. A floating (parasitic) capacitance of the gate electrode can be reduced to a very small value, so that a high sensitivity is maintained. Furthermore, the light receiving area is defined on a single crystalline silicon portion formed on an insulating layer, so that the area is completely isolated from other light receiving areas of other photodetector devices. The potential of the gate electrode storing electric charges resets to "0" directly after the detection, so that lag (persistence) can be prevented. Therefore the photodetector devices of the present invention are used for a solid state imaging device, whereby the accuracy and reliability of the image processing are increased.

It will be obvious that the present invention is not limited to the above-mentioned embodiments and that many variations are possible for persons skilled in the art without departing from the scope of the invention. For example, it is possible to reverse the conductivity types of all the portions and regions of the above-mentioned photodetector device and the polarities of all the applied voltages, it is also possible to form the gate extension portion of a doped single crystalline silicon portion joining the gate electrode and of a metal or silicide portion connected to another device.

I claim:

1. A semiconductor photodetector device for a solid state image sensing device, comprising:
    an insulating gate field effect transistor having a channel region and source and drain regions of a first conductivity type, a gate electrode of a second conductivity type, opposite to the first conductivity type, and a gate extension portion of the first conductivity type, said gate electrode and said gate extension portion forming a PN junction outside the channel region of said transistor and inside a photodetector area for detecting light; and
    means for applying a first voltage to said gate extension portion to reverse bias the PN junction and enable detection of light when the PN junction becomes temporarily conductive and supplies a voltage to said gate electrode, the voltage having a level determined by the intensity of the light of the photodetector area, and for applying a second voltage to said gate extension portion to forward bias the PN junction, reset said photodetector device and release carriers stored in said gate electrode.

2. A photodetector device according to claim 1, wherein said transistor further includes an isolation oxide layer surrounding the channel region, source region and drain region of said transistor, the PN junction being located on said isolation oxide layer.

3. A photodetector device according to claim 1, wherein said gate electrode and said gate extension portion are made of single crystalline silicon.

4. A photodetector device according to claim 1, wherein said transistor is formed on a single crystalline silicon substrate and further includes a gate oxide layer between said gate electrode and the single crystalline silicon substrate.

5. A photodetector device according to claim 1, wherein said transistor further includes a source electrode connected to said source region and a drain electrode connected to said drain region.

6. A photodetector device according to claim 1, wherein said transistor further includes a second gate electrode to form a dual gate type field effect transistor.

7. A semiconductor photodetector device comprising:
    an insulated gate field effect transistor having a channel region and source and drain regions of a first conductivity type, a gate electrode of doped silicon having a second conductivity type, opposite to the first conductivity type, and a gate extension portion of doped silicon having the first conductivity type, at least adjacent portions of said gate electrode and said gate extension portion being single crystalline silicon and forming a PN junction outside the channel region of said transistor and inside a photodetector area for detecting light; and means for applying a first voltage to said gate extension portion to reverse bias the PN junction and enable detection of light when the PN junction becomes temporarily conductive and supplies a voltage to said gate electrode, the voltage having a level determined by the intensity of the light of the photodetector area, and for applying a second voltage to said gate extension portion to forward bias the PN junction, reset said photodetector device and release carriers stored in said gate electrode.

8. A photodetector device according to claim 7, wherein said transistor further includes an isolation oxide layer surrounding the channel region, source region and drain region of said transistor, the PN junction being located on said isolation oxide layer.

9. A photodetector device according to claim 7, wherein said gate electrode and said gate extension portion, excluding the adjacent single crystalline silicon portions, are polycrystalline silicon.

10. A photodetector device according to claim 7, wherein said transistor is formed on a single crystalline silicon substrate and further includes a gate oxide layer between said gate electrode and the single crystalline silicon substrate.

11. A photodetector device according to claim 7, wherein said transistor further includes a source electrode connected to said source region and a drain electrode connected to said drain region.

12. A photodetector device according to claim 7, wherein said transistor further includes a second gate electrode to form a dual gate type field effect transistor.

* * * * *